United States Patent [19]

Wu

[11] Patent Number: 6,002,276
[45] Date of Patent: *Dec. 14, 1999

[54] STABLE OUTPUT BIAS CURRENT CIRCUITRY AND METHOD FOR LOW-IMPEDANCE CMOS OUTPUT STAGE

[75] Inventor: Michael A. Wu, Oro Valley, Ariz.

[73] Assignee: Burr-Brown Corporation, Tucson, Ariz.

[*] Notice: This patent is subject to a terminal disclaimer.

[21] Appl. No.: 09/213,333

[22] Filed: Dec. 16, 1998

Related U.S. Application Data

[63] Continuation of application No. 08/743,006, Nov. 1, 1996, Pat. No. 5,856,749.

[51] Int. Cl.[6] .................................................. H03K 5/22
[52] U.S. Cl. ........................... 327/66; 327/89; 327/513; 327/563; 330/253; 323/316
[58] Field of Search .................. 327/65, 66, 89, 327/513, 563; 330/252–257, 261–267, 269, 272, 273, 275, 285, 288, 289, 296; 323/315, 316

[56] References Cited

U.S. PATENT DOCUMENTS

| | | | |
|---|---|---|---|
| 4,284,957 | 8/1981 | Haque | 330/253 |
| 4,333,058 | 6/1982 | Hoover | 330/253 |
| 4,335,355 | 6/1982 | Haque | 330/253 |
| 4,383,223 | 5/1983 | Ulmer | 330/253 |
| 4,480,230 | 10/1984 | Brehmer et al. | 330/255 |
| 4,484,148 | 11/1984 | Wieser et al. | 330/253 |
| 4,656,436 | 4/1987 | Saari | 330/253 |
| 4,897,612 | 1/1990 | Carroll | 330/253 |
| 4,912,425 | 3/1990 | Kobayashi et al. | 330/253 |
| 5,162,753 | 11/1992 | Khorramahadi | 330/264 |
| 5,220,288 | 6/1993 | Brooks | 330/255 |
| 5,287,070 | 2/1994 | Thelen et al. | 330/253 |
| 5,363,059 | 11/1994 | Thiel | 330/253 |
| 5,446,412 | 8/1995 | Kimyacioglu et al. | 330/285 |
| 5,491,448 | 2/1996 | Naokawa et al. | 330/264 |
| 5,500,624 | 3/1996 | Anderson | 330/253 |
| 5,515,006 | 5/1996 | Chan | 330/255 |
| 5,596,289 | 1/1997 | Liu | 330/253 |
| 5,856,749 | 1/1999 | Wu | 327/89 |

FOREIGN PATENT DOCUMENTS

| | | | |
|---|---|---|---|
| 0 544 338 | 6/1993 | European Pat. Off. | 330/264 |
| 61-148906 | 7/1986 | Japan | 330/264 |
| 61-156910 | 7/1986 | Japan | 330/253 |
| 2-10904 | 1/1990 | Japan | 330/264 |
| 3-64108 | 3/1991 | Japan | 330/253 |
| 1246-339 | 7/1986 | Russian Federation | 330/261 |

*Primary Examiner*—Kenneth B. Wells
*Attorney, Agent, or Firm*—Cahill, Sutton & Thomas P.L.C.

[57] ABSTRACT

A CMOS output circuit including a differential error amplifier (3) is operated to provide a stable quiescent bias current in an output MOSFET by causing a first current equal to a threshold voltage of a P-channel reference MOSFET (M1) divided by the resistance of a reference resistor (R1) to flow through an N-channel current mirror control MOSFET (M4). A first N-channel current mirror output MOSFET (M6) having a gate coupled to the gate of the N-channel current mirror control MOSFET (M4) and a drain coupled to a drain of the P-channel reference MOSFET (M1) causes a second current proportional to the first current to flow through the P-channel reference MOSFET (M1). The first current is controlled in response to feedback from the P-channel reference MOSFET (M1). A bias current in an error amplifier (3) is controlled in response to the N-channel current mirror control MOSFET (M4). The bias current in the error amplifier and the resistances of first (R2) and second (R3) resistive load devices of the error amplifier are scaled to produce a drive voltage which applies a gate-to-source quiescent bias voltage to a P-channel pull-up MOSFET (M11) which is substantially equal to and tracks with the gate-to-source voltage of the reference MOSFET (M1).

6 Claims, 3 Drawing Sheets

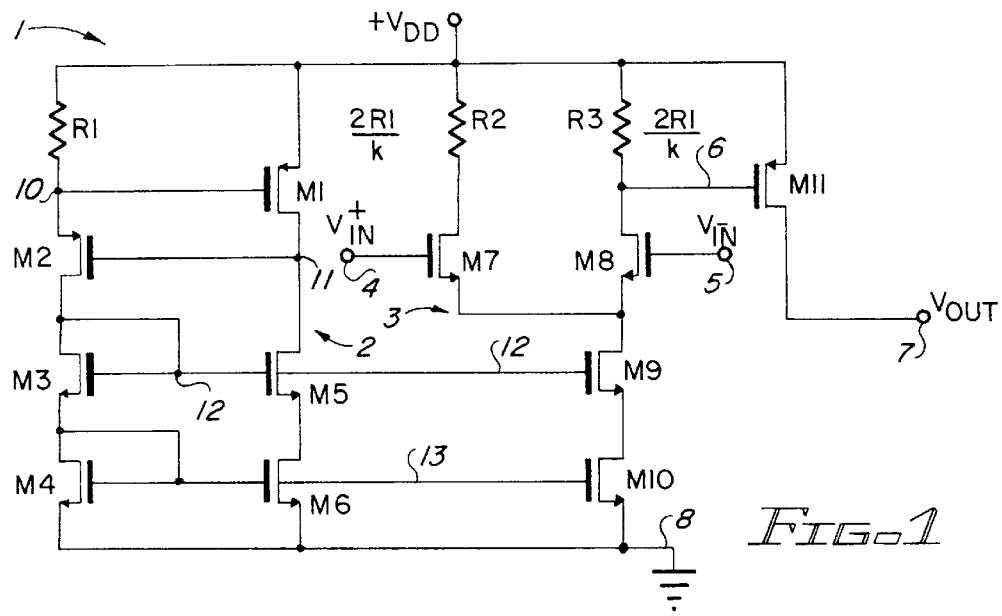
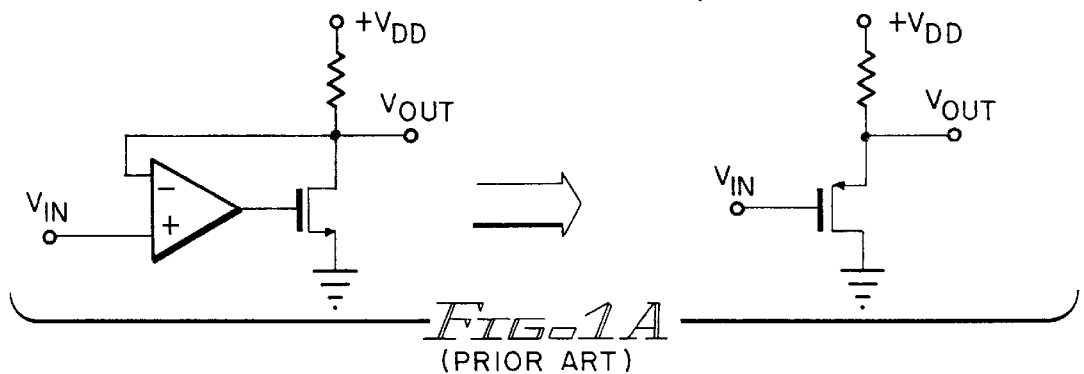
FIG. 1A
(PRIOR ART)
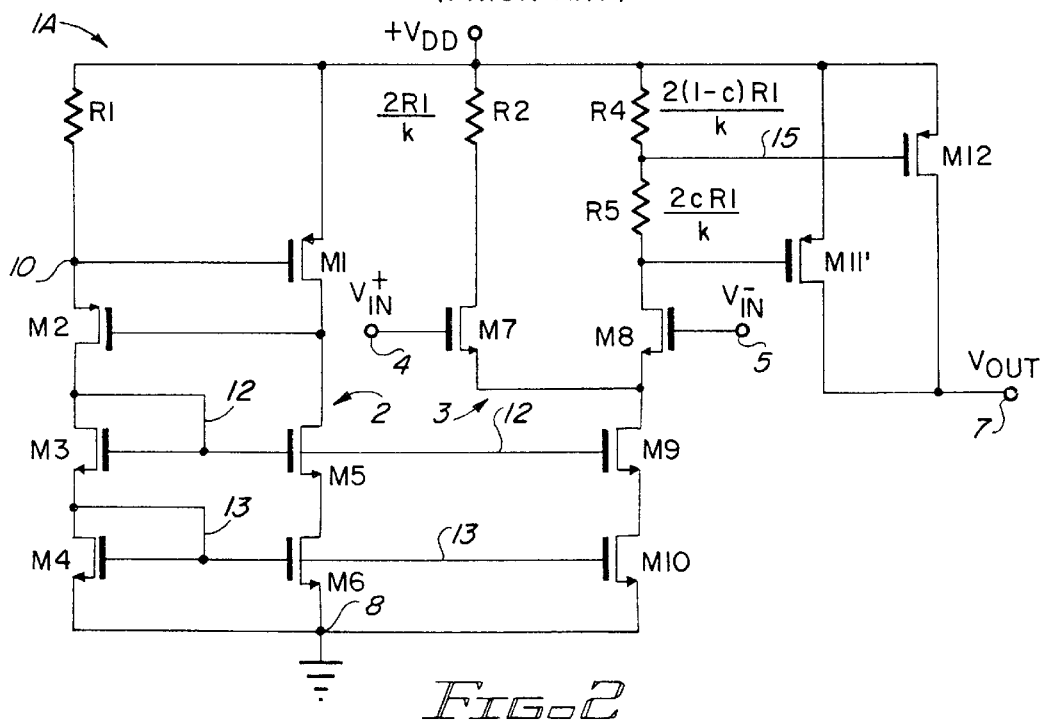

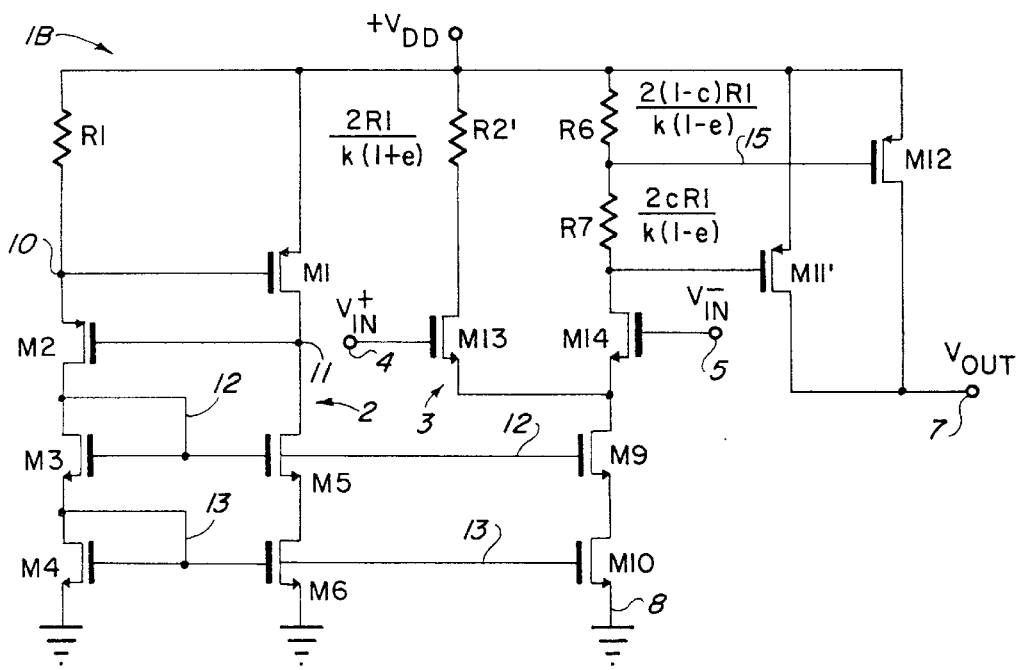
FIG.3
FIG.6
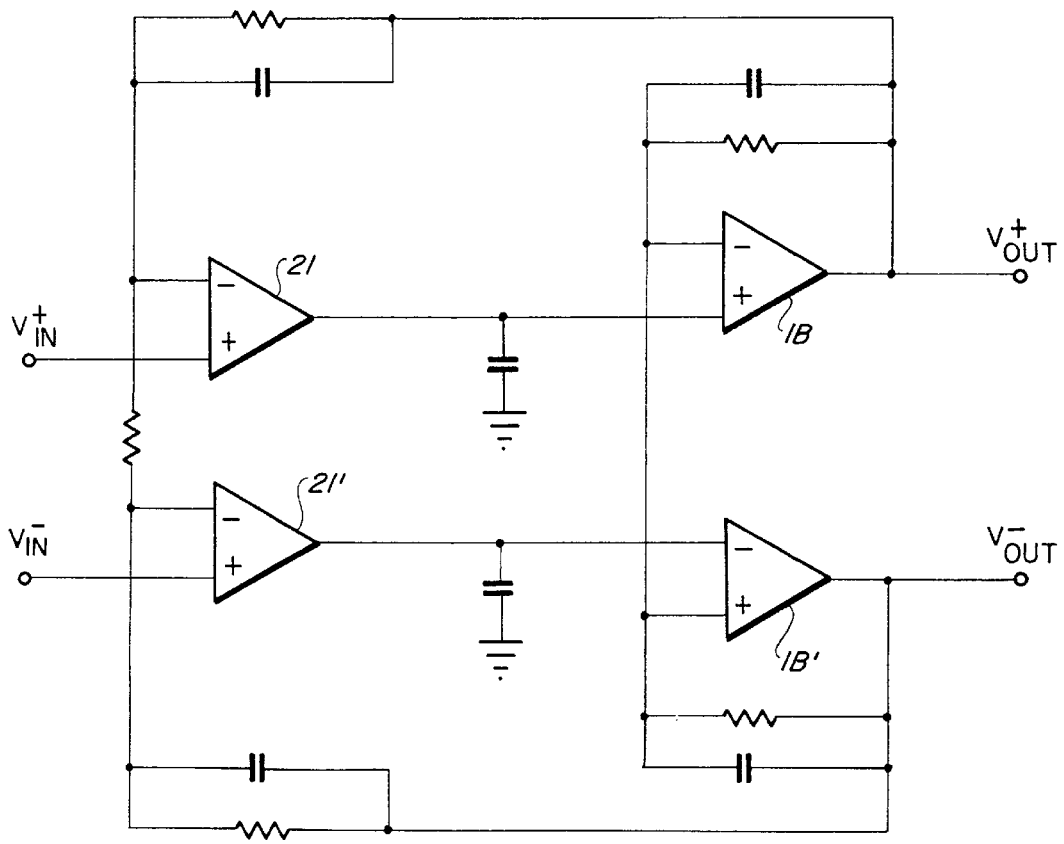

6,002,276

STABLE OUTPUT BIAS CURRENT CIRCUITRY AND METHOD FOR LOW-IMPEDANCE CMOS OUTPUT STAGE

This application is a continuation of allowed patent application Ser. No. 08/743,006, filed Nov. 1, 1996, by Michael A. Wu entitled "LOW-IMPEDANCE CMOS OUTPUT STAGE AND METHOD", now U.S. Pat. No. 5,856,749, incorporated herein by reference.

BACKGROUND OF THE INVENTION

The invention relates to CMOS amplifiers and low-impedance output stages therefor, and especially to low-impedance output stages that maintain acceptable levels of quiescent bias current in the output transistors thereof over usual variations of operating temperature, supply voltages, and integrated circuit processing parameters.

An ideal integrated circuit CMOS amplifier would have an output stage that provides very low output impedance, large output voltage swings between the positive and negative power supply voltage levels, a linear output signal, and low distortion. A selected DC or quiescent bias current in the output transistors of the output stage should be essentially constant for acceptable ranges of power supply voltage, mismatches between transistors, resistors and other components of the circuit, and various integrated circuit processing parameters.

Providing CMOS amplifier circuits with low output impedance and constant quiescent current (i.e., no load current) over an acceptable range of processing parameters and circuit operating conditions has been particularly challenging to those skilled in the art. It is known to use "quasi-devices", which include an error amplifier with a large output MOSFET of one channel type, e.g., N-channel, to "mimic" the behavior of a MOSFET of the opposite channel type (P-channel in this case). Such "quasi-devices" often are used in source-follower configurations as shown in FIG. 1A hereof. Output stages comprised of quasi-devices have low output impedance, as do source followers, and have the further advantage of larger output voltage swings than source followers.

In U.S. Pat. No. 4,480,230 (Brehmer et al.), additional circuitry is added to a class AB output stage to sense when large quiescent currents are flowing in the output MOSFETs to provide feedback which is used to attenuate the quiescent (no-load) current in the output MOSFETs. U.S. Pat. No. 5,162,752 (Khorramabadi) discloses use of class B output MOSFETs and class AB output MOSFETs connected in parallel and driven from separate error amplifiers. However, both the Brehmer et al. and Khorramabadi circuits are complex, and neither solves the problem of substantial variation in the amount of quiescent current that flows through the output MOSFETs as a function of typical variations in temperature, power supply voltage, and integrated circuit process parameters.

Referring to FIG. 1, the portion 2 of the illustrated bias circuit that includes resistor R1 and MOSFETs M1–M6 constitutes a prior art bias circuit which operates so as to keep MOSFET M1 at the edge of strong inversion, i.e., just at the edge of being turned "on". That bias circuit 2 is commonly used to provide bias voltage on conductors 12 and 13 to drive current mirror output transistors such as M9 and M10 in FIG. 1. Such current mirror output transistors function as a constant current source for a differential amplifier stage 3. However, the prior art portion 2 of the circuit 1 of FIG. 1 provides no guidance to solving the above mentioned problem of maintaining the quiescent bias current in the output transistors of a CMOS amplifier constant over typical ranges of power supply voltage, temperature, and CMOS processing parameters. Although some of the above-mentioned variations in integrated circuit process parameters can be compensated for by laser trimming of thin film resistors, it is desirable to avoid laser trimming, because it is a very costly process.

Consequently, there still is an unmet need for an improved low-impedance CMOS output stage which can provide large output voltage swings between positive and negative power supply voltages and which has substantially constant quiescent current in the output MOSFETS, without adding undue complexity to the circuitry of the output stage, and without incurring the costs associated with laser trimming of thin film resistors or the like.

SUMMARY OF THE INVENTION

Accordingly, it is an object of the invention to provide a low-impedance CMOS output stage which can be used to provide large output voltage swings into low impedance loads and steady DC bias current in the output transistors of such output stage over typical variations in power supply voltage, CMOS processing parameters, and chip temperature.

It is another object of the invention to provide a low-impedance CMOS output stage of the type described which avoids unacceptable circuit complexity and the need for laser trimming of resistor values.

Briefly described, and in accordance with one embodiment thereof, the invention provides a CMOS output circuit including a bias circuit (2), an error amplifier (3), and a first P-channel pull-up MOSFET (M11). The bias circuit (2) includes a first resistor (R1) coupled between a first supply voltage conductor (VDD) and a first conductor (10), a first P-channel MOSFET (M1) having a source coupled to the first supply voltage conductor (VDD), a gate coupled to the first conductor (10), and a drain coupled to a second conductor (11), a second P-channel MOSFET (M2) having a source coupled to the first conductor (10), a gate coupled to the second conductor (11), and a drain coupled to a drain and gate of a first N-channel current mirror control MOSFET (M4) having a source coupled to a second supply voltage conductor (8), and a first N-channel current mirror output MOSFET (M6) having a gate coupled to the gate of the first N-channel current mirror control MOSFET (M4), a source coupled to the second supply voltage conductor (8), and a drain coupled to the second conductor (11). The error amplifier (3) includes first (M7) and second (M8) N-channel input MOSFETs. A gate of the first N-channel input MOSFET (M7) is coupled to a first input terminal (4), and a gate of the second N-channel input MOSFET (M8) is coupled to a second input terminal (5). A second N-channel current mirror output transistor (M10) has a gate coupled to the gate of the first N-channel current mirror control transistor (M4), a source coupled to the second supply voltage conductor (8), and a drain coupled to sources of the first (M7) and second (M8) N-channel input MOSFETs. First (R2) and second (R3) resistive load circuits are coupled between the first supply voltage conductor (VDD) and drains of the first (M7) and second (M8) N-channel input MOSFETs, respectively. The first P-channel pull-up MOSFET (M11) has a gate coupled to the drain of the second (M8) P-channel input MOSFET, a source coupled to the first supply voltage conductor (VDD), and a drain coupled to an output terminal (7). The resistances of the first (R2) and second (R3)

resistive load circuits are balanced to bias the first P-channel pull-up MOSFET (M11) near strong inversion to cause it to produce a first bias current which is a predetermined multiple of a bias current which flows through the first P-channel MOSFET (M1). The first bias current is produced by the first P-channel MOSFET (M1) being biased at the edge of its strong inversion condition. The channel-width-to-channel-length ratio of the second N-channel current mirror output MOSFET (M10) is a first scale factor k times the channel-width-to-channel-length ratio of the first P-channel current mirror control transistor (M4) and the resistance of the first (R2) and second (R3) resistive load circuits are proportional to the resistance of the first resistor (R1) divided by the predetermined factor k.

In another embodiment, the second resistive load circuit (R3) includes a first load resistor (R4) coupled between the first supply voltage conductor (VDD) and a third conductor (15) and a second load resistor (R5) coupled between the third conductor and the drain of the second N-channel input MOSFET (M8). The CMOS output circuit includes a second P-channel pull-up MOSFET (M12) having a source coupled to the first supply voltage conductor (VDD), a gate coupled to the third conductor (15), and a drain coupled to the output conductor (7). The first load resistor (R4) has a resistance proportional to a factor (1−c) multiplied by the resistance (R1) of the first resistor (R1) divided by the first scale factor k, and the second load resistor (R5) has a resistance proportional to a second scale factor c multiplied by the resistance (R1) of the first resistor (R1) divided by the first scale factor k, to cause the second P-channel pull-up MOSFET (M12) to produce a second quiescent bias current produced by the second P-channel pull-up MOSFET (M12) being biased on a weak inversion condition.

In another embodiment, the resistance of the first (R2') and second (R6+R7) load circuits are unbalanced to increase the gate drive voltage swings to the first (M11') and second (M12) P-channel pull-up MOSFETS, and the channel-width-to-channel-length ratios of the first (M13) and second (M14) N-channel input MOSFETs are unbalanced to increase the gate drive voltage swings to the first (M11') and second (M12) P-channel pull-up MOSFETs. The resistance of the first load circuit (R2') is proportional to the resistance (R1) of the first resistor (R1) divided by the product of the predetermined factor k and 1+e, wherein e is balance constant, and the resistance of the first load resistor (R6) is proportional to the product of the resistance of the first resistor (R1) and 1−c divided by the product of the predetermined factor k and 1−e, wherein c is an input offset compensation constant, and the resistance of the second load resistor (R7 in FIG. 3) is proportional to the product of the resistance of the first resistor R1, and the offset compensation constant c divided by the product of the predetermined factor k and 1−e.

If the P-channel MOSFETs all are replaced by N-channel MOSFETs and vice versa, and the first and second supply voltage conductors are interchanged, the pull-up MOSFETs become pull-down MOSFETs, and the two types of CMOS output circuits can be interconnected to provide a high frequency CMOS push-pull output circuit having very stable quiescent bias current.

BRIEF DESCRIPTION OF THE DRAWINGS

FIG. 1 is a schematic diagram of a first embodiment of the invention.

FIG. 1A is a circuit diagram illustrating prior art "quasi-devices" which can be used to mimic MOS source follower circuits.

FIG. 2 is a schematic diagram of a second embodiment of the invention.

FIG. 3 is a schematic diagram of a third embodiment of the invention.

FIG. 6 is a diagram of a differential input, differential output amplifier using the low-impedance CMOS output stage of the present invention.

DETAILED DESCRIPTION OF THE PREFERRED EMBODIMENTS

Figure 4:
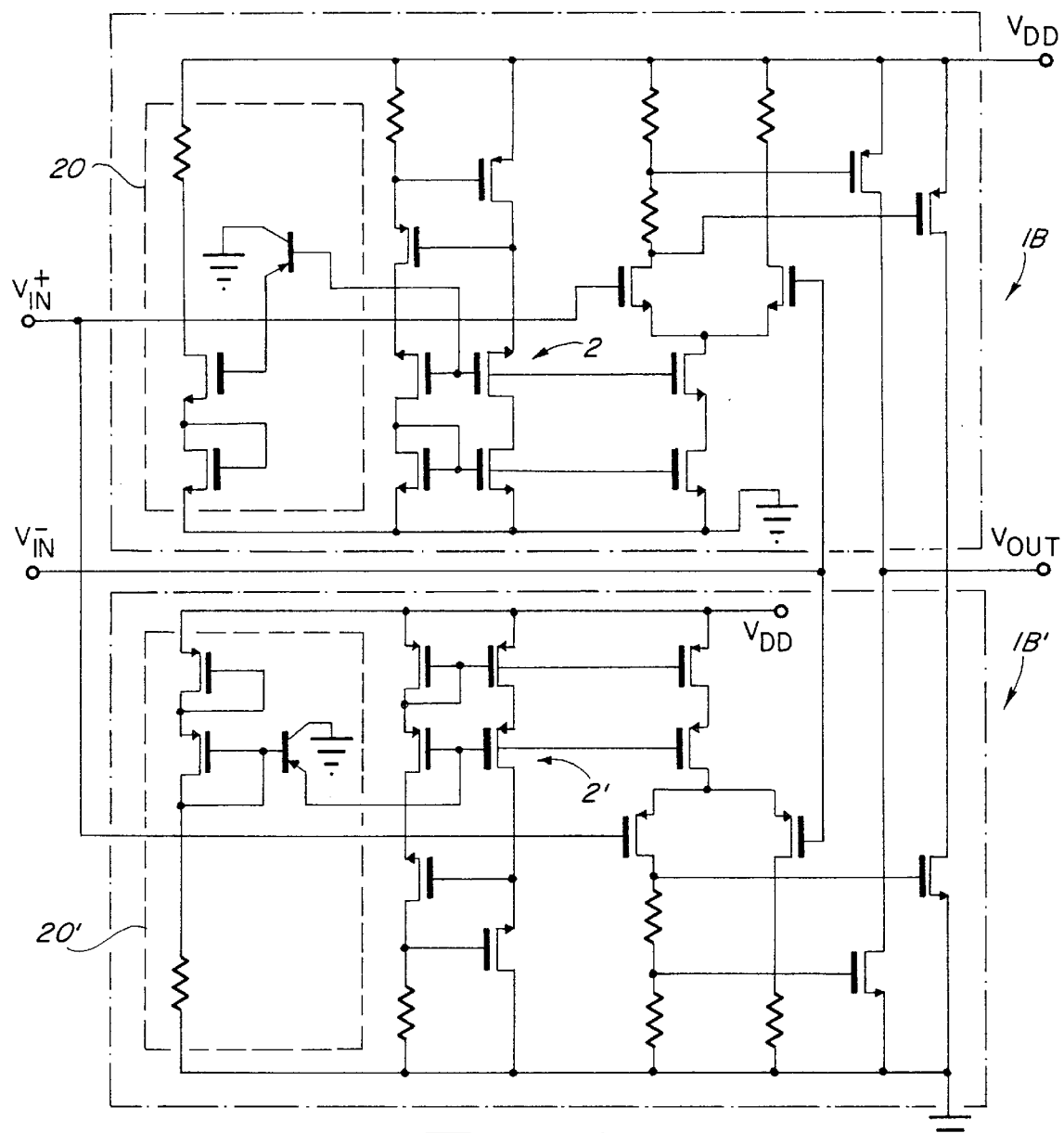
FIG. 4 is a schematic diagram of a push-pull CMOS amplifier using the circuit of FIG. 3 and a like circuit with all MOSFET channel types reversed.

Referring to FIG. 1, low-impedance CMOS output pull-up circuit 1 includes the above mentioned bias circuit 2 and differential amplifier error circuit 3, and also a P-channel MOSFET M11 which functions as a low-impedance output pull-up transistor. Bias circuit 2 includes resistor R1, which may have a resistance of 6 kilohms, connected between $V_{DD}$ and conductor 10. Conductor 10 is connected to the gate of P-channel reference MOSFET M1, the source of which is connected to $V_{DD}$ and the drain of which is connected to conductor 11. The channel width and length of MOSFET M1 can be 600 microns and 0.8 microns, respectively. Conductor 10 is connected to the source of P-channel MOSFET M2, which has its gate connected to conductor 11 and its drain connected to conductor 12. The channel width and length of MOSFET M2 can be 100 microns and 0.6 microns, respectively. Conductor 12 is connected to the gate and drain of N-channel MOSFET M3 and to the gate of N-channel MOSFET M5, which has its drain connected to conductor 11. The source of MOSFET M3 is connected to conductor 13. The gate and drain of N-channel MOSFET M4 are connected to conductor 13 and the source of MOSFET M4 is connected to the ground conductor 8 which may be the most negative supply voltage. The source of N-channel MOSFET M6 is connected to ground, and its drain is connected to the source of MOSFET M5. The channel width and channel length of each of MOSFETs M3–6 may be 25 microns and 0.6 microns, respectively.

Those skilled in the art will recognize that conductor 11 provides feedback to P-channel MOSFET M2 which causes MOSFET M2 to limit the current through resistor R1 to a level that keeps P-channel reference MOSFET M1 turned on right at its edge of strong inversion. This is because if more than that amount of current flows through MOSFET M1, the voltage on conductor 11 increases, reducing the gate-to-source voltage applied to MOSFET M2 and therefore reduces the amount of current through resistor R1, and hence also reduces the gate-to-source voltage of reference MOSFET M1. Thus, it is the nature of the feedback to maintain MOSFET M1 just at its edge of strong inversion.

Error amplifier 3 includes N-channel current source MOSFET M10 having its source connected to ground, its gate connected to conductor 13, and its drain connected to the source of a second N-channel current source M9. MOSFET M4 is a current mirror control transistor, and MOSFETs M6 and M10 are current mirror output transistors. MOSFET M9 has its gate connected to conductor 12 and its drain connected to the sources of N-channel input MOSFETs M7 and M8. MOSFET M10 has its gate connected to conductor 13, its drain connected to the source of MOSFET M9, and its source connected to ground. The channel width of MOSFETs M9 and M10 are scaled up by a factor of k from the channel width of MOSFETs M3 and M4, and for a value of k equal to 4, the channel width of MOSFETs M9 and M10 may be 100 microns (the channel length thereof being 0.6 microns, the same as for MOSFETs M3 and M4).

The gates of input MOSFETs M7 and M8 are connected to conductors 4 and 5, respectively. The channel width and length of input MOSFETs 7 and 8 may be 200 microns and 0.6 microns, respectively. $V_{IN}{}^+$ and $V_{IN}{}^-$ are applied to input conductors 4 and 5, respectively. A load resistor R2 which may have a resistance 2×R1/k is connected between $V_{DD}$ and the drain of input MOSFET M7. (Preferably, the resistance of load resistors R2 and R3 is reduced by at least the current scale factor k to increase the bandwidth of pull-up circuit 1.) Load resistor R3, which may have the same resistance as load resistor R2, is connected between $V_{DD}$ and conductor 6. Conductor 6 is connected to the drain of input MOSFET M8 and to the gate of P-channel output MOSFET M11, which has its source connected to $V_{DD}$ and its drain connected to output conductor 7.

In bias circuit 2, the current in a first leg including resistor R1 and MOSFETs M2, M3, and M4 is approximately equal to the P-channel threshold voltage $V_{TP}$ of MOSFET M1 divided by the resistance R1 of resistor R1. The current flowing through a second leg including MOSFETs M1, M5, and M6 is identical to that in the first leg because the current through current mirror output transistor M6 is the same as the current through current mirror control transistor M4. The value of R1 is selected so that MOSFET M1 is biased just at the onset of strong inversion, i.e., so it is just beginning to conduct a significant amount of current.

The current through resistor R1, multiplied by the scale factor k, then flows through the constant current source MOSFETs M9 and M10 of error amplifier 3. Increasing the current flowing through error amplifier 3 by the scale factor k allows the resistances of resistors R2 and R3 to be reduced in proportion to k, thereby decreasing the associated RC time constants and increasing the bandwidth of output circuit 1. Then, if $V_{IN}{}^+$ is equal to $V_{IN}{}^-$, with resistors R2 and R3 having the above indicated resistances, the gate-to-source voltage of output MOSFET M11 is exactly equal to the gate-to-source voltage of bias circuit MOSFET M1, and output MOSFET M11 also will be right on the edge of strong inversion.

This is a very useful result because it establishes the quiescent bias current of output MOSFET M11 fairly independently of typical variations in $V_{DD}$, the P-channel and N-channel MOSFET process parameters, and the chip temperature. For example, my computer simulations indicate approximate variation by a factor of 1.5 to 2 in total quiescent current for the circuit of FIG. 2 over the normal range of P-channel and N-channel process parameters and the normal range of chip temperature. This compares very favorably with prior art circuits, some of which experience variations by factors of as much as about 100 in their total quiescent current for the normal ranges of process parameters and chip temperature.

Consequently, output MOSFET M11 can be designed to have a large channel-width-to-channel-length ratio (much larger than that of MOSFET M1) and therefore provide a low output impedance without fear of excessively high quiescent bias currents for worst case values of $V_{DD}$, MOSFET threshold voltages, and other CMOS process parameters.

Typically, the pull-up output circuit 1 of FIG. 1 would have its output conductor 7 connected to a load circuit (not shown) and also to a pull-down output circuit that is identical to pull-up driver circuit 1 except that the circuit structure is "inverted" between ground and $V_{DD}$ in the sense that the various P-channel MOSFETS are replaced with corresponding N-channel MOSFETs, and the N-channel MOSFETs are replaced with corresponding P-channel MOSFETs. This would provide a high frequency, low distortion, low output impedance push-pull output circuit similar to the one shown in FIG. 4.

Note that in an integrated circuit chip layout it is desirable that MOSFET M1 be physically located as close as possible to output MOSFET M11, preferably with both MOSFETs M1 and M11 located relative to each other on a common thermal centroid, to ensure that the temperature of bias MOSFET M1 accurately tracks the temperature of pull-up MOSFET M11 during operation.

One problem with the output circuit of FIG. 1 is that biasing of pull-up MOSFET M11 is dependent upon the input offset voltage of error amplifier 3. That input offset voltage is dependent upon the matching between input MOSFETs M7 and M8, especially the threshold voltages thereof, and also on the degree of matching between load resistors R2 and R3. If the polarity of such input offset voltage is such that it increases the current through input MOSFET M8, then the quiescent bias current through pull-up MOSFET M11 also will increase, and the increase may be dramatic (e.g., by a factor as of much as 10), if the designed value of quiescent current lies on a steep part of the $I_{DRAIN}$ versus $V_{GS}$ characteristic of MOSFET 11.

This problem is addressed by the modified pull-up output driver circuit 1A shown in FIG. 2, wherein load resistor R3 is replaced by the series connection of load resistors R4 and R5, with resistor R4 connected between $V_{DD}$ and conductor 15. The above-mentioned dramatic increase in the quiescent bias current through pull-up MOSFET 11 of FIG. 1 then becomes a much smaller increase, by a factor of only about 1.5 to 2 rather than 10, for the combined quiescent currents in pull-up MOSFETs M11' and M12 of FIG. 2.

In FIG. 2, resistor R5 is connected between conductors 6 and 15. Pull-up MOSFET M11' of FIG. 2 replaces MOSFET M11 of FIG. 1 (and is connected exactly the same as MOSFET 11). In FIG. 2 an additional P-channel pull-up MOSFET M12 has its source electrode connected to $V_{DD}$, its drain electrode connected to conductor 7, and its gate connected to conductor 15. In essence, the output pull-up MOSFET 11 of FIG. 1 is "split" into the two parallel connected P-channel MOSFET pull-ups M11' and M12. Generally, the channel-length-to-channel-width ratio of pull-up MOSFET M12 is much larger (e.g., ten times larger) than that of pull-up MOSFET M11'. The resistance of resistor R5 typically is much smaller than the resistance of resistor R4. As indicated in FIG. 2, the resistance of R5 can be 2×c×R1/k, and the resistance of resistor R4 can be 2(1−c)R1/k, c being a scale factor which determines the relationship between resistors R4 and R5 and is chosen so that pull-up transistor M12 is never turned on too strongly under quiescent (i.e., no-load) conditions over a reasonable range of error amplifier input offset voltages. In the described embodiment, c can have a value of 0.05. Even though pull-up MOSFET M11' may be turned on too strongly as a result of error amplifier offset voltage, its size is greatly reduced compared to that of MOSFET M11 of FIG. 1. The configuration of FIG. 2 prevents the sum of the quiescent bias currents in both MOSFETs M11' and M12 from being too great.

While the further improved embodiment of FIG. 2 overcomes the problem of heavy dependency of the quiescent current through the output pull-up MOSFETs on the input offset voltage of the error amplifier 3, the amount of available "gate drive" to produce the gate-to-source voltage of the pull-up MOSFETs M11' and M12 is determined by the portions of the bias current from MOSFETs M9 and M10 flowing through each of pull-up resistors R4 and R5. For the above indicated values of R2, R4 and R5 in FIG. 2, half of the error amplifier bias current supplied by constant current source MOSFETs M9 and M10 flows through each branch of error amplifier 3, if the offset voltage is zero, and that amount of current multiplied by the resistance of resistor R2 is equal to the threshold voltage $V_{TP}$ of P-channel pull-up MOSFET M11. Consequently, for a large differential input voltage, the maximum increase that can be achieved in the amount of current through resistors R4 and R5 is to approximately double it by steering all of the constant bias current through resistors R4 and R5. This limits the maximum gate drive voltage available to pull-up MOSFET M11' to roughly twice its threshold voltage $V_{TP}$.

This can be problematic, especially if the actual threshold voltage $V_{TP}$ is on the low end of its range. The output stage 1B of FIG. 3 provides a solution to this problem by unbalancing the currents through MOSFETS M7 and M8 so that only one fourth of the current supplied by MOSFET M10 flows through MOSFET M8 and the rest flows through MOSFET M7.

Referring to FIG. 3, the output pull-up circuit 1B is identical to circuit 1A of FIG. 2 except the relationship between the resistance of the error amplifier resistor load circuits R2 and R4+R5 is modified and the relative geometries of input MOSFETS M7 and M8 also are similarly modified. Specifically, load resistors R4 (having resistance 2(1−c)R1/k) and R5 (having resistance 2cR1/k) of FIG. 2 are replaced by load resistors R6 (having resistance 2(1−c)R1/(k(1−e)) and R7 (having resistance 2cR1/(k(1−e)) in FIG. 3, respectively, where e is a scale factor which may have a value of 0.5. Load resistor R2 (having resistance 2R1/k) of FIG. 2 is replaced by load resistor R2' (having resistance 2R1/(k(1+e)) in FIG. 3. Input MOSFETs M7 and M8, (both having a channel width WD) are replaced by N-channel input MOSFETs M13 (with a channel width of (1+e)WD)) and M14 (with a channel width of (1−e)WD), respectively, where WD is the width of MOSFETs M7 and M8 in FIG. 2.

Thus, the two branches of differential error amplifier 3 in FIG. 3 are unbalanced according to the scale factor e so that under quiescent conditions (i.e., $V_{IN}^+$ is equal to $V_{IN}^-$) significantly more current flows through input MOSFET M13 than through input MOSFET M14. The unbalance is achieved by multiplying the width of MOSFET M7 of FIG. 2 by the factor 1+e to obtain the channel width of MOSFET M13, dividing the resistance of resistor R2 of FIG. 2 by the factor 1+e to obtain the resistance of resistor R2' in FIG. 3, multiplying the width of MOSFET M8 in FIG. 2 by the factor 1−e to obtain the channel width of MOSFET M14 of FIG. 3, and dividing the resistances of each of resistors R4 and R5 in FIG. 2 by 1−e to obtain the resistances of R6 and R7 in FIG. 3. Then, if e is equal to 0.5, three times as much current flows through resistor R2' as through resistors R6 and R7 while the bias voltages on output transistors M11' and M12 are maintained at the same levels as in FIG. 2. Under high input drive conditions, all of the current flowing through resistor R2' (with $V_{IN}^+$ equal to $V_{IN}^-$) is available to flow through resistors R6 and R7. Consequently, the gate drive on pull-up MOSFET M11' can increase to approximately four times its original level $V_{TP}$, rather than only two times as in the circuit of FIG. 2. Consequently, the gate drive to pull-up MOSFET M11' can reach approximately four times the threshold voltage $V_{TP}$.

The increased available maximum gate drive voltage on conductors 6 and 15 allows use of significantly smaller transistors for pull-up MOSFETS M11' and M12. This reduces the gate capacitances of pull-up MOSFETs M11' and M12, reducing the associated RC time constants and increasing the circuit bandwidth while providing the desired low impedance and low maximum total quiescent bias current of both pull-up transistors M11' and M12 under worst case temperature variations (−40° C. to +125° C.) and CMOS process paramater variations.

It should be appreciated that the foregoing "unbalancing" technique can be used without "splitting" R3 of FIG. 1 into R4 and R5 and adding pull-up MOSFET M12 as in FIG. 2. For example, if the circuit of FIG. 3 is modified by omitting MOSFET M12 and combining resistors R6 and R7 into a single resistor having a resistance equal to the sum of the resistances of R6 and R7, then the above-mentioned "unbalanced" version of the circuit of FIG. 1 will be achieved. That single resistor then would have a resistance of 2R1/(k(1−e)), which is the sum of the resistances of resistors R6 and R7 in FIG. 3. The channel widths of input MOSFETs M13 and M14 will be the same as in FIG. 3, and the benefits of a smaller output MOSFET M11' and associated improved bandwidth would be obtained with the circuit connections of FIG. 1.

FIG. 4 shows a connection of output driver circuit 1B of FIG. 3 and a second "complementary" output driver circuit 1B' in which the $V_{DD}$ and ground connectors and the channel types of all MOSFETs of output driver circuit 1B have been reversed to provide a pull-down output stage circuit, whereby a push-pull output stage is provided. The widths of such "reversed" N-channel MOSFETs which have substituted for P-channel MOSFETs and vice versa to obtain the complementary output driver circuit 1B' should, of course, be adjusted to account for the different conductivities of N-channel and P-channel MOSFEtS. Additional MOSFETs, resistors and PNP transistors have been added as shown in blocks 20 and 20' to ensure start-up of the bias circuits 2 and 2'.

Figure 5:
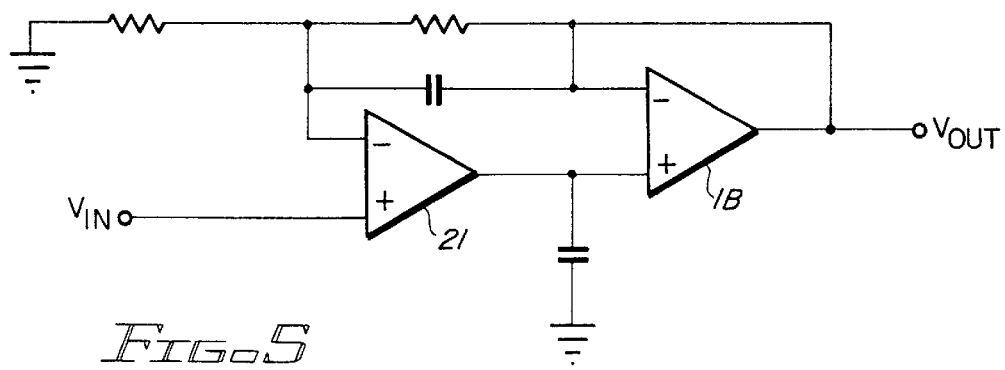
FIG. 5 is a diagram of a single-ended amplifier using the low-impedance CMOS output stage of the present invention.

The circuit 1B of FIG. 4 can be used with a high gain differential preamplifier 21 to provide the buffer amplifier shown in FIG. 5. Two output drivers 1B and 1B' as shown in FIG. 4 can be combined with two preamplifiers 21 and 21' to provide a differential buffer circuit shown in FIG. 6. The circuit shown in FIG. 6 has been tested. The total bias current of the circuit of FIG. 6, including the two output stages 1B and 1B' and the preamplifiers 21 and 21', typically was measured to about 11 milliamperes, a maximum value thereof being about 14 milliamperes. Small signal bandwidth was measured to be in excess of 10 megahertz, with total harmonic distortion levels of lower than −70 dB with the output $V_{OUT}$ driving a 6 volt peak-to-peak 100 kilohertz sine wave output signal into a 100 ohm load, with a measured DC output impedance of less than 0.1 ohms. This circuit works very well as a component of analog "front end" integrated chips for digital subscriber line applications.

Thus, the present invention solves the shortcomings of the closest prior art by controlling the quiescent current through the output pull-up and pull-down transistors by means of components which already are part of the signal path, rather than by adding additional bias sensing control circuitry, and by establishing the quiescent bias current in response to a reference device the performance of which tracks closely with the temperature and CMOS processing parameters of the output MOSFETs through which the load currents flow. Low crossover distortion and good linearity of $V_{OUT}$ are achieved because of the essentially constant quiescent bias current is the output MOSFETs.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A method of operating a CMOS output circuit including a differential error amplifier to provide a stable quiescent bias current in a first-conductivity-type output MOSFET, the method comprising the steps of:
   (a) causing a first current equal to a threshold voltage of a first-conductivity-type reference MOSFET divided by the resistance of a reference resistor to flow through a second-conductivity-type current mirror control MOSFET;
   (b) causing a second current proportional to the first current to flow through the first-conductivity-type reference MOSFET by means of a first second-conductivity-type current mirror output MOSFET having a gate coupled to the gate of the second-conductivity-type current mirror control MOSFET and a drain coupled to a drain of the first-conductivity-type reference MOSFET, and controlling the first current in response to feedback from the first-conductivity-type reference MOSFET;
   (c) controlling a bias current in an error amplifier in response to the voltage of the gate of the second-conductivity-type current mirror control MOSFET; and
   (d) scaling the bias current of the error amplifier and the resistances of first and second resistive load devices of the error amplifier to produce a drive voltage which applies a quiescent gate-to-source voltage that is substantially equal to and tracks with the gate-to-source voltage of the reference MOSFET to a first-conductivity-type output MOSFET.

2. A CMOS output circuit including a bias circuit, the bias circuit including a first resistor coupled between a first supply voltage conductor and a first conductor, a first first-conductivity-type MOSFET having a source coupled to the first supply voltage conductor, a gate coupled to the first conductor, and a drain coupled to a second conductor, a second first-conductivity-type MOSFET having a source coupled to the first conductor, a gate coupled to the second conductor, and a drain coupled to a drain and gate of a first second-conductivity-type current mirror control MOSFET having a source coupled to a second supply voltage conductor, and a first second-conductivity-type current mirror output MOSFET having a gate coupled to the gate of the first second-conductivity-type current mirror control MOSFET, a source coupled to the second supply voltage conductor, and a drain coupled to the second conductor, wherein the first first-conductivity-type MOSFET is biased at the edge of its strong inversion condition, the improvement comprising:
   (a) an error amplifier including
      i. a first second-conductivity-type input MOSFET, a gate of the first second-conductivity-type input MOSFET being coupled to a first input terminal,
      ii. a second second-conductivity-type input MOSFET, a gate of the second second-conductivity-type input MOSFET being coupled to a second input terminal,
      iii. a second second-conductivity-type current mirror output MOSFET having a gate coupled to the gate of the first second-conductivity-type current mirror control MOSFET, a source coupled to the second supply voltage conductor, and a drain coupled to sources of the first and second second-conductivity-type input MOSFETs,
      iv. a first resistive load coupled between the first supply voltage conductor and a drain of the first second-conductivity-type input MOSFET;
      v. a second resistive load coupled between the first supply voltage conductor and a drain of the second second-conductivity-type input MOSFET; and
   (b) a first-conductivity-type output MOSFET having a gate coupled to the drain of the second second-conductivity-type input MOSFET, a source coupled to the first supply voltage conductor, and a drain coupled to an output terminal,
   a voltage produced by the error amplifier on the gate of the first-conductivity-type output MOSFET producing a stable quiescent bias current in the first-conductivity-type output MOSFET which is a predetermined multiple of a bias current flowing through the first first-conductivity-type MOSFET to cause the first-conductivity-type output MOSFET to be biased at the edge of its strong inversion condition similarly to the first first-conductivity-type MOSFET.

3. The CMOS output circuit of claim 2 wherein the first conductivity type is P type and the second conductivity type is N type and the output MOSFET is a pull-up MOSFET.

4. The CMOS output circuit of claim 2 wherein the first conductivity type is N type and the second conductivity type is P type and the output MOSFET is a pull-down MOSFET.

5. A method of operating a CMOS output circuit including a differential error amplifier to provide a stable quiescent bias current in a first-conductivity-type output MOSFET, the method comprising the steps of:
   (a) causing a first current equal to a threshold voltage of a first-conductivity-type reference MOSFET divided by the resistance of a reference resistor to flow through a current mirror control transistor;
   (b) causing a second current proportional to the first current to flow through the reference MOSFET by means of a first current mirror output transistor having a control electrode coupled to the control electrode of the current mirror control transistor and a first electrode coupled to a drain of the reference MOSFET, and controlling the first current in response to feedback from the reference MOSFET;
   (c) controlling a bias current in an error amplifier in response to the voltage of the control electrode of the current mirror control transistor; and
   (d) scaling the bias current of the error amplifier and the resistances of first and second resistive load devices of the error amplifier to produce a drive voltage which applies a quiescent gate-to-source voltage that is substantially equal to and tracks with the gate-to-source voltage of the reference MOSFET to the first-conductivity-type output MOSFET.

6. A CMOS output circuit including a bias circuit, the bias circuit including a first resistor coupled between a first supply voltage conductor and a first conductor, a first-conductivity-type reference MOSFET having a source coupled to the first supply voltage conductor, a gate coupled to the first conductor, and a drain coupled to a second conductor, a first transistor having a first electrode coupled to the first conductor, a control electrode coupled to the second conductor, and a second electrode coupled to a first electrode and control electrode of a first current mirror control transistor having a second electrode coupled to a second supply voltage conductor, and a first current mirror output transistor having a control electrode coupled to the control electrode of the current mirror control transistor, a first electrode coupled to the second supply voltage conductor, and a second electrode coupled to the second conductor, wherein the reference MOSFET is biased at the edge of its strong inversion condition, the improvement comprising:

(a) an error amplifier including
   i. a first input transistor, a control electrode of the first input transistor being coupled to a first input terminal,
   ii. a second input transistor, a control electrode of the second input transistor being coupled to a second input terminal,
   iii. a second current mirror output transistor having a control electrode coupled to the control electrode of the current mirror control transistor, a first electrode coupled to the second supply voltage conductor, and a second electrode coupled to first electrodes of the first and second input transistors,
   iv. a first resistive load coupled between the first supply voltage conductor and a second electrode of the first input transistor;
   v. a second resistive load coupled between the first supply voltage conductor and a second electrode of the second input transistor; and (b) a first-conductivity-type output MOSFET having a gate coupled to the second electrode of the second input transistor, a source coupled to the first supply voltage conductor, and a drain coupled to an output terminal, a voltage produced by the error amplifier on the gate of the output MOSFET producing a stable quiescent bias current in the output MOSFET which is a predetermined multiple of a bias current flowing through the reference MOSFET to cause the output MOSFET to be biased at the edge of its strong inversion condition similarly to the reference MOSFET.

* * * * *